United States Patent [19]

Kung

[11] Patent Number: 4,591,743
[45] Date of Patent: May 27, 1986

[54] TEMPERATURE COMPENSATED CURRENT SENSING CIRCUIT

[75] Inventor: David Kung, San Jose, Calif.

[73] Assignee: National Semiconductor Corporation, Santa Clara, Calif.

[21] Appl. No.: 562,936

[22] Filed: Dec. 19, 1983

[51] Int. Cl.$^4$ .......................... G06G 7/10; G06G 7/12
[52] U.S. Cl. .................................. 307/491; 307/310; 307/494; 307/350; 307/270; 328/3; 330/289
[58] Field of Search ............... 307/310, 491, 494, 270, 307/350; 328/3; 357/28; 330/256, 289, 143; 331/176

[56] References Cited

U.S. PATENT DOCUMENTS

| | | | |
|---|---|---|---|
| 4,122,403 | 10/1978 | Cave | 330/289 |
| 4,210,827 | 7/1980 | Kanazawa et al. | 307/264 |
| 4,352,053 | 9/1982 | Oguchi et al. | 323/220 |

OTHER PUBLICATIONS

"Temperature Control for Sensitive Electronic Components", by B. J. Milander, vol. 19, No. 2, Jul. 1976.

Primary Examiner—Stanley D. Miller
Assistant Examiner—Richard Roseen
Attorney, Agent, or Firm—Gail W. Woodward; Paul J. Winters; Michael J. Pollock

[57] ABSTRACT

A metal resistor having a positive temperature coefficient of resistance is connected to a current source to develop a voltage drop that acts as an offset for a $\Delta V_{BE}$ differential amplifier. Since this offset voltage has a positive temperature coefficient it will compensate the resistor coefficient to develop a constant current. The constant current can be employed in a current sink sense-shutoff combination or it can be used to develop a plural output current source/sink combination.

4 Claims, 3 Drawing Figures

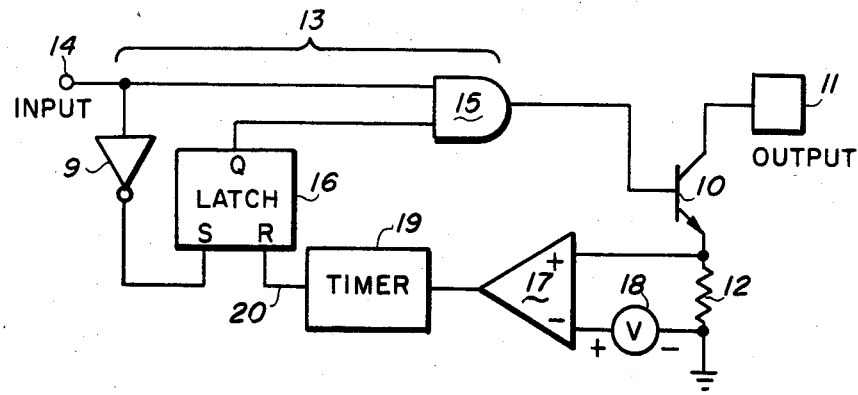
Fig_1 (PRIOR ART)
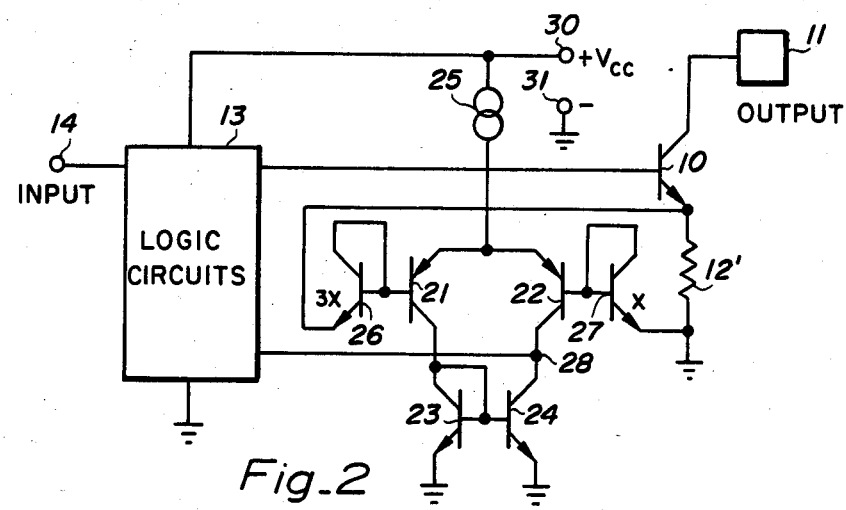
Fig_2
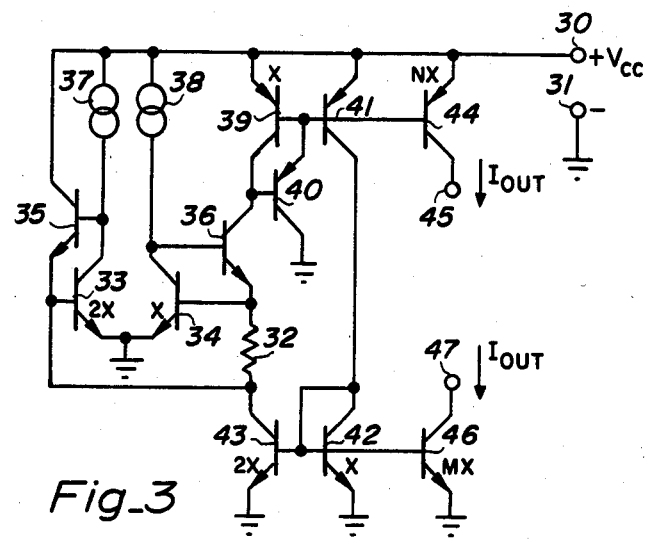
Fig_3

4,591,743

TEMPERATURE COMPENSATED CURRENT SENSING CIRCUIT

BACKGROUND OF THE INVENTION

Resistors are often employed in integrated circuit (IC) structures to develop currents that operate the circuits or to sense currents by developing a voltage drop. However, such resistors often have unacceptable high temperature coefficients. For example, if the aluminum metallization is employed to create a resistor, its value will vary almost 50% over the temperature range of 0° to 125° C. This in combination with the normal manufacturing tolerances will yield a very large overall variation in resistor value.

SUMMARY OF THE INVENTION

It is an object of the invention to develop a temperature compensated current in an IC using the aluminum metallization to form a resistor and developing a $\Delta V_{BE}$ related voltage across the resistor whereby the current is temperature compensated.

It is a further object of the invention to couple an aluminum metallization resistor in series with a current sink transistor and to couple the resulting voltage drop to an amplifier that has a $\Delta V_{BE}$ related offset whereby the amplifier-resistor combination provides a temperature compensated current sensing response.

These and other objects are achieved as follows. An aluminum metallization resistor is created having a positive temperature coefficient of resistance. Since $\Delta V_{BE}$ also has a nearly matching positive temperature coefficient, if the voltage across the resistor is related to $\Delta V_{BE}$ the current therein will be compensated. In one embodiment the aluminum resistor is coupled in series with a peripheral driver sink transistor. The voltage developed across the resistor is coupled to a sense amplifier having an offset related to $\Delta V_{BE}$. When the voltage across the resistor exceeds the amplifier offset it will switch thereby indicating that a temperature compensated current threshold has been exceeded. The sense amplifier output can be employed to terminate the drive to the sink transistor. In another embodiment a current is developed in an amplifier in which the $\Delta V_{BE}$ offset is supplied by the voltage drop across the resistor. Such a current will be temperature compensated because the resistor temperature coefficient will cancel that of the offset. The current can then be mirrored to supply both sources and sinks in the IC.

BRIEF DESCRIPTION OF THE DRAWING

FIG. 1 is a combination schematic and block diagram of a prior art peripheral driver current sensing and shutoff circuit.

FIG. 2 is a schematic diagram of the circuit of the invention as applied to a peripheral driver.

FIG. 3 is a schematic diagram of the circuit of the invention as applied to an IC current source/sink combination.

DESCRIPTION OF THE PRIOR ART

FIG. 1 shows a prior art peripheral driver with current responsive shut off. Transistor 10, when turned on, sinks current flowing into terminal 11. The sink current flows through resistor 12 to ground. Resistor 12 is chosen small enough to minimize the voltage drop developed when conducting the maximum sink current. Transistor 10 has its base driven from logic circuitry 13 in response to a logic input at terminal 14. AND gate 15 directly drives the base of transistor 10 and one of its two inputs is obtained from input terminal 14. The other input to AND gate 15 is obtained from the Q output of latch 16, the set input of which is also obtained from input terminal 14 through inverter 9. If line 20, the reset input to latch 16 is low, the logic applied to terminal 14 will be repeated at the base of transistor 10. However, if line 20 is high, the base drive ceases and transistor 10 remains off. This is the logic shutoff mechanism.

It is desirable to shut the peripheral driver transistor off when its sinking current exceeds its rated value. This is the purpose of diff-amp 17. The diff-amp input includes an offset voltage source 18. The offset is polarized so that the output of diff-amp 17 will be low as long as the voltage drop across resistor 12 is less than the offset voltage. When the voltage drop across resistor 12 exceeds the offset voltage, the output of op-amp 17 will then go high. Timer 19 monitors this condition. If this high state lasts longer than a predetermined time period, the timer output, on line 20, goes high and in turn forces the Q output of latch 16 low thus turning the drive to transistor 10 off. If this high state is shorter than the predetermined time period, line 20 will stay low and nothing happens to transistor 10. Timer 19 assures that the high current condition has to exist for at least the predetermined time period so that short transients will not shut the driver off. Latch 16 can be cleared by toggling terminal 14.

One way to implement the FIG. 1 circuit is to employ a constant value temperature compensated source of offset voltage 18. Then a constant value low temperature coefficient (TC) resistor 12 is coupled into the emitter of transistor 10. Since IC resistors normally have a relatively large TC, they cannot be employed at resistor 12 and an external low TC resistor is connected off the IC chip. This of course involves an extra IC pin for each driver circuit located therein. For a quad driver, four extra pins would be required. It would be much more desirable to include resistor 12 on chip. In addition, practical considerations like bonding wire, pin and contact resistances restrict the minimum value of the external resistor 12. Therefore, for a given output current, the output voltage, $V_{OL}$, becomes undesirably high.

DESCRIPTION OF THE INVENTION

The basis of the invention is the use of a $\Delta V_{BE}$ voltage source at 18 and the use of an aluminum metal resistor at 12. The TC of aluminum is given at +0.00391. Thus, resistor 12 would be a low value IC resistor fabricated from aluminum metallization. Offset voltage source 18 would be a $\Delta V_{BE}$ source which has a TC of +0.00336 at room temperature. Both of these TC values will hold relatively constant over the range of 0° to 125° C. It can be seen that the $\Delta V_{BE}$ TC value will compensate the resistor TC so that 0.00391−0.00336=0.00055. When this is multiplied by 125, a value of 0.069 is obtained. This indicates a response of 6.9% or ±3.5% over the 0°–125° C. temperature range. This is an acceptable tolerance for shut off current over temperature.

FIG. 2 shows an implementation of the invention for a diff-amp input stage for developing an internal $\Delta V_{BE}$ offset voltage. The circuit is operated from a $V_{CC}$ power supply connected between + terminal 30 and ground terminal 31. As the temperature varies and the value of resistor 12' varies, the $\Delta V_{BE}$ value will change to compensate. Resistor 12' is fabricated from the IC aluminum metallization to have a resistance of 33.6 milliohms. This can be accomplished using a 1.5 micron thick aluminum metallization 6 mils wide by 10.67 mils long.

The op-amp input stage is made up of matched PNP transistors 21 and 22 differentially connected and supplied with operating current from source 25. Matched NPN transistors 23 and 24 are coupled as a current mirror load having a single ended output at node 28.

The bases of transistors 21 and 22 are coupled via diode connected transistors 26 and 27 to provide the offset differential inputs. Transistor 26 is shown having three times the emitter area of transistor 27 so that an input offset is obtained as a $\Delta V_{BE}$ value. Since $$\Delta V_{BE} = \ln(I_1/I_2) \cdot (kT)/q$$

where $I_1/I_2$ is the current density ratio for transistors 26 and 27, k is Boltzmanns constant, T is the kelvin temperature, and q is the electron charge; $\Delta V_{BE}$ will be 28.5 millivolts at 300° kelvin. When resistor 12' is 33.6 milliohms and a current of 850 milliamps flows in transistor 10 the base currents of transistors 21 and 22 will be equal. For this condition output node 28 will be at $V_{BE}$ and the circuit is at balance. For lower transistor 10 current values node 28 will go low (below $V_{BE}$) and for higher values of current node 28 will go high (above $V_{BE}$). Thus the amplifier will provide a switching output as a comparator with an 850 milliampere critical value.

FIG. 3 shows an alternative embodiment of the invention. Here a current source is based upon a resistor created from aluminum metallization on an IC and the current flowing through it is related to the $\Delta V_{BE}$ of a pair of ratioed area transistors operated at the same current.

Resistor 32 is a metal resistor created from the aluminum metallization on the IC. A suitable value would be, for example, 9 ohms. Transistor 33 is ratioed to be twice the area of transistor 34 and resistor 32 is connected between the transistor bases so that $\Delta V_{BE}$ is developed across the resistor. For the ratio shown $\Delta V_{BE}$ would be 18 millivolts at 300°k. Thus, 2 ma will flow through resistor 32. Matched transistors 35 and 36 are connected to respectively force transistors 33 and 34 to act as diodes. Matched current sources 37 and 38 each supply an equal amount of current to their respective transistors 33 and 34. A feedback loop is formed by transistors 33–36 to force the voltage across resistor 32 to stay at the $\Delta V_{BE}$ value (18 mv.).

The current flowing in resistor 32 also flows in transistor 39 which is forced by transistor 40 to act as a diode in a super beta current mirror along with transistor 41. Since transistors 39 and 41 are matched this mirror will have unity current gain. Thus, 2 ma will also flow in transistor 41. This same current will flow in diode-connected transistor 42 which is ratioed at one half the size of transistor 43. Thus, 4 ma will flow in transistor 43.

Transistor 44 which is also slaved to the current in transistor 39 is ratioed at NX so that it conducts N times 2 ma to terminal 45. If desired transistor 44 can be a plurality N of separate transistor current sources. Likewise, current sink transistor 46 is slaved to transistor 42 and is ratioed at MX to sink current from terminal 47. If desired, transistor 46 can be a plurality M of separate current sinks.

In operation as the value of resistor 32 rises with increasing temperature the $\Delta V_{BE}$ appearing across resistor 32 also rises so that the current flowing therein is temperature compensated.

EXAMPLE

The circuit of FIG. 2 was constructed in the form of a quad IC chip using the aluminum resistor described. Conventional PN junction isolated monolithic IC construction was employed. The maximum output current sink range varied from 630 ma to 1.1 amperes due to process variations. But for a particular device it remains substantially constant over the operating temperature range.

The invention has been described and two embodiments detailed. An operating example is also shown. When a person skilled in the art reads the foregoing description, alternatives and equivalents, within the spirit and intent of the invention, will become apparent. Accordingly, it is intended that the scope of the invention be limited only by the following claims.

I claim:

1. A temperature compensated current sensing integrated circuit amplifier comprising:
    a resistor constructed from metallization to have a positive temperature coefficient of resistance and having a predetermined value;
    means for passing a current to be sensed through said resistor to produce a voltage drop thereacross;
    a differential transistor amplifier constructed to have an offset potential that is established by differential current densities in a pair of transistors; and
    means for coupling said resistor to the input of said differential transistor amplifier whereby said voltage drop across said resistor opposes said offset potential so that said offset potential varies as a function of temperature to compensate the temperature coefficient of said resistor.

2. The circuit of claim 1 wherein said integrated circuit is fabricated in silicon and said resistor is composed of aluminum.

3. The circuit of claim 2 wherein said means for passing a current to be sensed comprises a current sinking transistor that is driven by logic control elements and said differential amplifier is coupled to said logic control elements to terminate the drive to said current sinking transistor when said current to be sensed exceeds a predetermined temperature compensated value.

4. The circuit of claim 2 wherein said means for passing a current to be sensed comprises a current mirror having an input that is driven by a current flowing in said differential transistor amplifier and the voltage drop developed across said resistor is due to the output current of said current mirror whereby said current to be sensed is temperature compensated and said current mirror can be coupled to drive a plurality of current source and current sink transistors.

* * * * *